(12) United States Patent
Hönigschmid et al.

(10) Patent No.: US 6,477,078 B2
(45) Date of Patent: Nov. 5, 2002

(54) INTEGRATED MEMORY HAVING MEMORY CELLS THAT EACH INCLUDE A FERROELECTRIC MEMORY TRANSISTOR

(75) Inventors: Heinz Hönigschmid, East Fishkill, NY (US); Marc Ullmann, Hamburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/963,007

(22) Filed: Sep. 25, 2001

(65) Prior Publication Data

US 2002/0044478 A1 Apr. 18, 2002

Related U.S. Application Data

(63) Continuation of application No. PCT/DE00/00901, filed on Mar. 24, 2000.

(30) Foreign Application Priority Data

Mar. 25, 1999 (DE) .......................................... 199 13 571

(51) Int. Cl.[7] .............................................. G11C 11/22
(52) U.S. Cl. .......................... 365/145; 365/65; 365/149
(58) Field of Search ................................ 365/145, 149, 365/65, 117, 185.21, 230.02

(56) References Cited

U.S. PATENT DOCUMENTS

| 4,184,207 A | * | 1/1980 | McElroy ................ 365/185.16 |
| 5,541,871 A | | 7/1996 | Nishimura et al. ......... 365/145 |
| 5,563,081 A | | 10/1996 | Ozawa ........................ 438/3 |
| 5,640,345 A | * | 6/1997 | Okuda et al. ................ 365/184 |
| 5,822,239 A | * | 10/1998 | Ishihara et al. ............. 365/145 |
| 6,067,244 A | * | 5/2000 | Ma et al. ..................... 365/145 |

FOREIGN PATENT DOCUMENTS

| EP | 0 459 572 A2 | 12/1991 |
| EP | 0 827 153 A2 | 3/1998 |
| WO | WO 99/19878 | 4/1999 |

OTHER PUBLICATIONS

"A Divided/Shared Bit–Line Sensing Scheme for ULSI DRAM Cores" (Hdaka et al.), IEEE Journal of Solid State Circuits, vol. 26, No. 4, Apr. 1991, pp. 473–78.
"Low Power Digital CMOS Design" (Chandrakasan et al.), Kluwer Academic Publishers, 1995, pp. 242–45.

* cited by examiner

*Primary Examiner*—David Nelms
*Assistant Examiner*—Gene N. Auduong
(74) *Attorney, Agent, or Firm*—Laurence A. Greenberg; Werner H. Stemer; Gregory L. Mayback

(57) ABSTRACT

An integrated memory has word lines that run in a first direction, and bit lines and control lines that run in a second direction, which is perpendicular to the first direction. A controllable path of each memory transistor connects one of the bit lines to one of the control lines. The control electrode of each memory transistor is connected to one of the word lines. Since the bit lines and control lines run in the same direction and are thus arranged parallel to one another, they can be arranged within a common wiring plane of the integrated memory. Since the terminals of the controllable path are usually likewise arranged in a common wiring plane, for example in a substrate of the integrated memory, it is possible, to arrange the bit lines and control lines in the same wiring plane as the controllable path of the transistors.

4 Claims, 2 Drawing Sheets

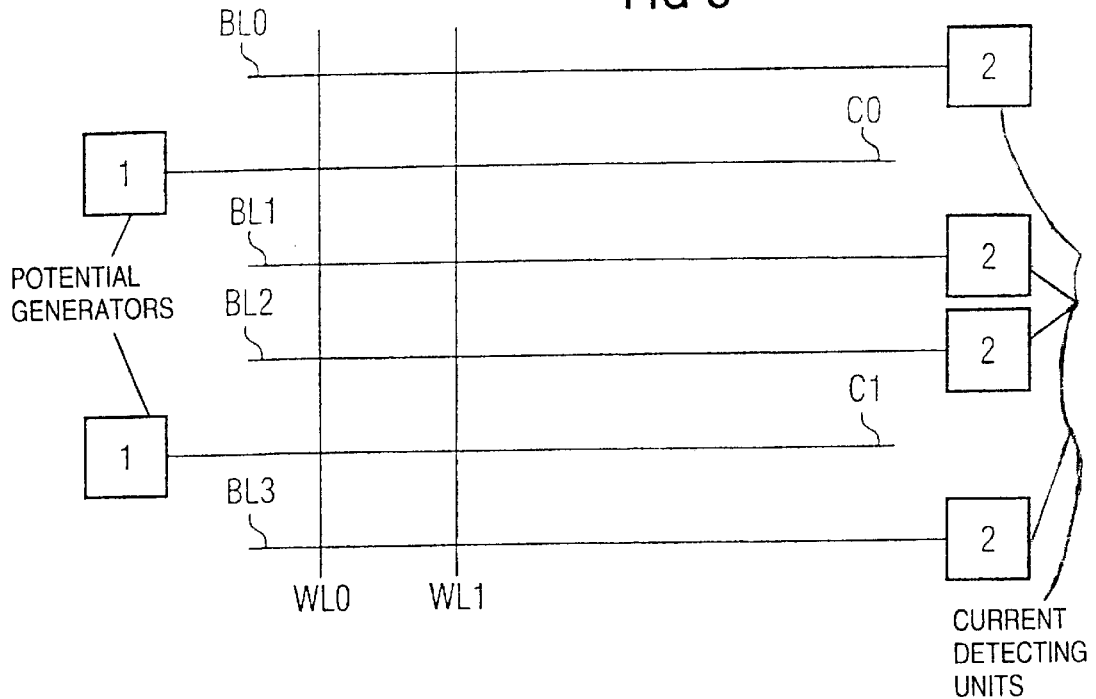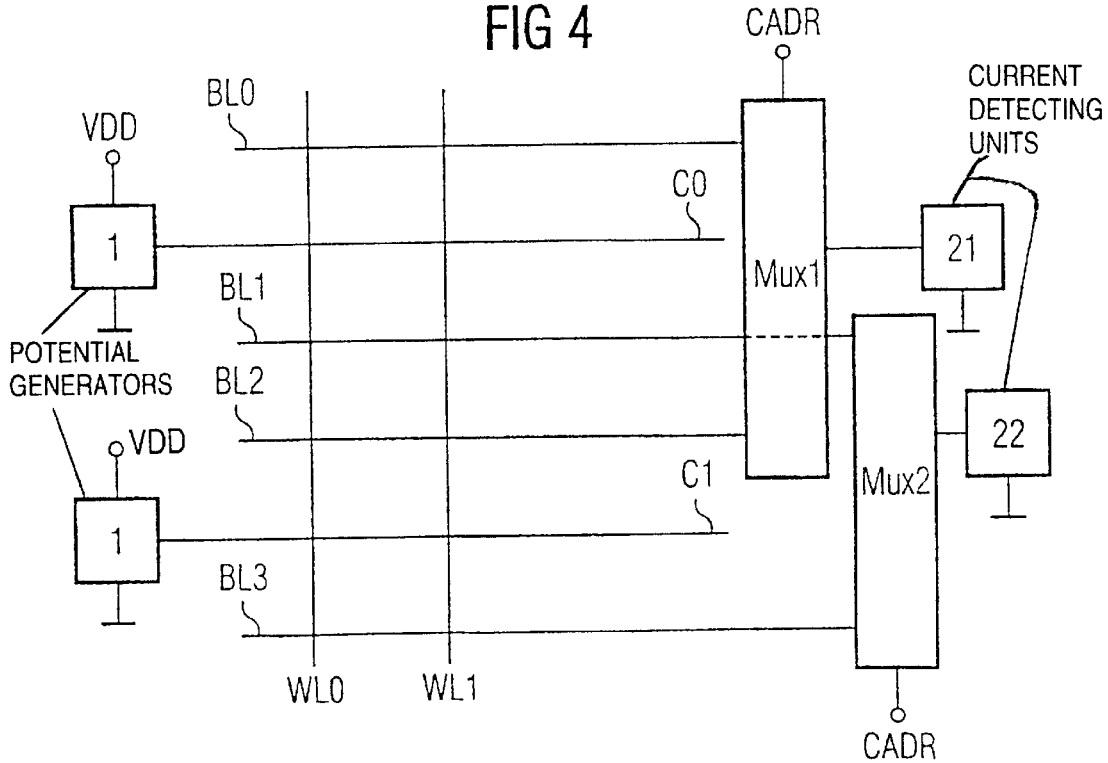

INTEGRATED MEMORY HAVING MEMORY CELLS THAT EACH INCLUDE A FERROELECTRIC MEMORY TRANSISTOR

CROSS-REFERENCE TO RELATED APPLICATION

This application is a continuation of copending International Application No. PCT/DE00/00901, filed Mar. 24, 2000, which designated the United States.

BACKGROUND OF THE INVENTION

Field of the Invention

The invention relates to an integrated memory having memory cells that each include a ferroelectric memory transistor.

U.S. Pat. No. 5,541,871 describes a ferroelectric semiconductor memory whose memory cells each comprise a ferroelectric memory transistor. Ferroelectric transistors have a ferroelectric gate dielectric. By applying a voltage pulse to the control electrode of the transistor, the direction of polarization of the ferroelectric, and hence, the threshold voltage of the transistor is set. With a predetermined drain-source voltage of the transistor, a different drain current is produced depending on the threshold voltage of the transistor.

For the read-out of the memory transistors, U.S. Pat. No. 5,541,871 teaches applying a predetermined drain-source voltage to the transistor and bringing the gate of the transistor to a potential which turns the transistor on. The source-drain current that is established is subsequently detected. If a low drain current is detected, a first polarization state of the ferroelectric dielectric of the transistor gate electrode is involved. If a large drain current is detected, a second polarization state of the ferroelectric is involved. Two different logic states stored by the transistor are distinguished in this way.

U.S. Pat. No. 5,541,871 teaches that the memory cells formed by the ferroelectric memory transistors are arranged in the form of a matrix. Their source terminals are connected to source lines which run parallel in a first direction. Their drain terminals are connected to parallel drain lines which run in a second direction, perpendicular to the first direction. Their gates or control electrodes are connected to control lines which run in the second direction and have the function of word lines. Since the source lines and the drain lines run perpendicularly to one another, it is necessary, in order to avoid short circuits, that they run in different wiring planes of the memory at least in the region of their crossover. The drain terminals and the source terminals of the transistors to which these lines are connected are arranged in a substrate of the memory and thus in a common wiring plane.

SUMMARY OF THE INVENTION

It is accordingly an object of the invention to provide an integrated memory having memory cells that each include a ferroelectric memory transistor which is fabricated in a simplified manner compared with the prior art specified above.

With the foregoing and other objects in view there is provided, in accordance with the invention, an integrated memory that includes a plurality of memory cells. Each one of the plurality of the memory cells includes a ferroelectric memory transistor with a control electrode having a ferroelectric layer that can assume at least two different polarization states. The memory includes a plurality of word lines that essentially run in a first direction, and a plurality of bit lines that essentially run in a second direction that is perpendicular to the first direction. The memory includes a plurality of control lines that essentially run in the second direction. Each one of the memory transistors includes a controllable path that connects one of the plurality of the bit lines to one of the plurality of the control lines. The control electrode of each one of the memory transistors is connected to one of the plurality of the word lines. A respective one of the plurality of the control lines is configured between two of the plurality of the bit lines and is connected to the two of the plurality of the bit lines by the controllable paths of a plurality of the memory transistors. The controllable paths of the memory transistors are configured parallel to the plurality of the bit lines and parallel to the control lines. Ones of the memory transistors that are connected to a given one of the plurality of the bit lines have common source/drain regions.

The integrated memory according to the invention has word lines which run in a first direction, and also bit lines which run in a second direction, which is perpendicular to the first direction, and control lines. A controllable path of each memory transistor in each case connects one of the bit lines to one of the control lines. The control electrode of each memory transistor is connected to one of the word lines.

Since the bit lines and control lines run in the same direction and are thus arranged parallel to one another, they can be arranged within a common wiring plane of the integrated memory. Since the terminals of the controllable path (these are the drain/source regions in a MOS transistor) are usually likewise arranged in a common wiring plane, for example in a substrate of the integrated memory, it is possible, in the integrated memory according to the invention, to arrange the bit lines and control lines in the same wiring plane as the controllable path of the transistors. This results in a space-saving, simple construction of the memory. Plated-through holes which connect different wiring planes of the memory to one another are not necessary for producing a connection between the bit lines or control lines and the associated terminals of the transistor paths to be controlled. Moreover, parallel arrangement of the bit lines and control lines results in a highly regular arrangement of the memory cell matrix.

Operation of the integrated memory can be implemented by applying a predetermined voltage to the controllable path of one of the memory transistors and activating the word line connected to this transistor. The resulting current which flows between the relevant control line and the associated bit line is subsequently detected.

In accordance with an added feature of the invention, a respective one of the control lines is arranged between, in each case, two of the bit lines, to which it is connected in each case via the controllable paths of a plurality of the memory transistors. This enables the memory to have an extremely compact construction. In this memory, a read-out of one of the memory transistors can be effected as follows: a predetermined voltage is applied between one of the control lines and the two associated bit lines, one of the word lines is activated, so that two of the memory transistors connected to the word line and the relevant control line are selected, and the respective current through these two transistors is detected.

In accordance with an additional feature of the invention, the controllable paths of the memory transistors are arranged parallel to the bit lines and control lines, in other words they also run in the second direction. Furthermore, those memory transistors which are connected to the same bit line, in each case, have common source/drain regions. This further reduces the space requirement of the integrated memory. The parallel arrangement of the bit lines and control lines means that, in the second direction, the controllable paths of any desired number of adjacent memory transistors can be connected to one another.

In accordance with another feature of the invention, the integrated memory has current detecting units, which are connected to a respective one of the bit lines, for detecting a current that flows between the control lines and the bit lines, during a read access, via the memory transistors. By virtue of the fact that a current detecting unit is assigned to each bit line in this way, a respective one of the memory cells can be read out during a read access on each of the bit lines.

In accordance with a concomitant feature of the invention, the integrated memory has at least two multiplexers and two current detecting units. Two of the bit lines which are connected to two different control lines via their memory transistors are connected to the first current detecting unit via the first multiplexer. Two others of the bit lines, which are connected via their memory transistors to the same two control lines as the first two bit lines, are connected to the second current detecting unit via the second multiplexer. The multiplexers have two operating states, in which they respectively connect one of the bit lines connected to them to the respective current detecting unit.

In this development, two bit lines are, in each case, assigned to a common current detecting unit. In the event of a read access, a selection as to which of these two bit lines is in each case intended to be evaluated by the current detecting unit is effected by means of the multiplexers. Consequently, it is possible to reduce the number of current detecting units.

Other features which are considered as characteristic for the invention are set forth in the appended claims.

Although the invention is illustrated and described herein as embodied in integrated memory having memory cells each having a ferroelectric memory transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows an exemplary embodiment in which each bit line is assigned to a current detecting unit; and FIG. 4 shows an exemplary embodiment in which, in each case, two bit lines are assigned a common current detecting unit.

DESCRIPTION OF THE PREFERRED EMBODIMENTS

Figure 1:
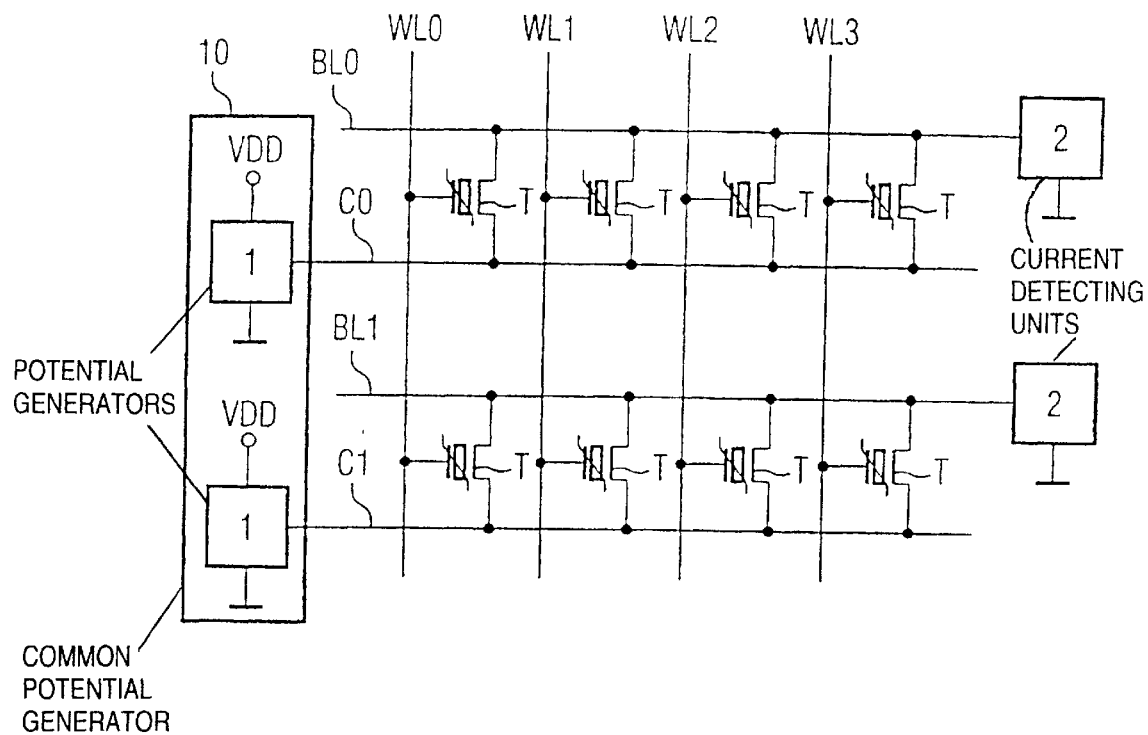
FIG. 1 shows a first exemplary embodiment of a memory in which each control line is assigned to a bit line.

Referring now to the figures of the drawing in detail and first, particularly, to FIG. 1 thereof, there is shown an integrated memory that has word lines WLi arranged parallel to one another, and that also has bit lines BLi and control lines Ci arranged perpendicularly thereto. The bit lines BLi and control lines Ci are arranged alternately and are regularly spaced apart from one another. Memory cells in the form of ferroelectric memory transistors T are arranged at crossover points between the word lines WLi, the bit lines BLi and the control lines Ci. They connect the associated bit line BLi to the associated control line Ci via their controllable paths. Control terminals of the memory transistors T are connected to the associated word line WLi. Although FIG. 1 only shows four word lines WLi and two bit lines BLi and two control lines Ci, in reality the memory has a much larger number of these lines, resulting overall in a much larger memory cell array.

The ferroelectric memory transistors T have a ferroelectric gate dielectric which can assume two different polarization states through voltage pulses on the word line WLi connected to them. Two different logic information items are stored in this way. This information is evaluated by measuring a current flowing during a read access to the memory cells via the channel paths of the transistors T.

In the case of the memory in FIG. 1, each of the control lines Ci is connected to the output of a potential generator 1, which supplies a constant read potential VDD in the event of a read access to the memory cells. As indicated in FIG. 1, instead of separate potential generators 1 for each control line Ci, it is possible to provide a common potential generator 10 whose output potential is fed to all the control lines Ci.

In FIG. 1, each bit line BLi is connected to a current detecting unit 2. The latter can have for example, a non-reactive resistor across which a voltage is dropped that is proportional to the current flowing through the resistor. This voltage is fed to an evaluation arrangement as a measure of the current.

A read access to the memory illustrated in FIG. 1 takes place as follows:

Before the read access, the word lines WLi, the bit lines BLi and the control lines Ci are at a low potential, for example ground. In other words, the potential generators 1 are not activated. In order to initiate a read access, the potential generators 1 are activated and generate the read potential VDD on the control lines Ci. This read potential VDD corresponds to the high supply potential of the integrated memory. Afterward, by means of a word line decoder (not illustrated), one of the word lines WLi is addressed and changed over from the low level to a high level. The memory transistors T connected to this word line WLi are turned on as a result of this. As a result of the read potential VDD present on the control lines Ci, a drain current flows via the selected memory transistors T and flows via the associated bit line BLi to the respective current detecting unit 2. A positive voltage is present between the output of the potential generator 1 and the respective current detecting unit 2.

Depending on whether a logic zero or a logic one is stored in the memory transistor T, its ferroelectric gate dielectric has a different polarization. This results in different threshold voltages for the two different logic states. The different threshold voltages result in a different conductivity of the memory transistors T for the respectively activated word line. If a stored logic one is involved, the drain current that is established is larger than if a stored logic zero is involved. In the extreme case, during the read-out of a logic zero, no drain current at all flows via the respective memory transistor T, in other words its value is zero. This is the case when, through the associated polarization state of the gate dielectric, the threshold voltage of the memory transistor T is raised to such an extent that it is not exceeded by the potential on the associated word line WLi.

Figure 2:
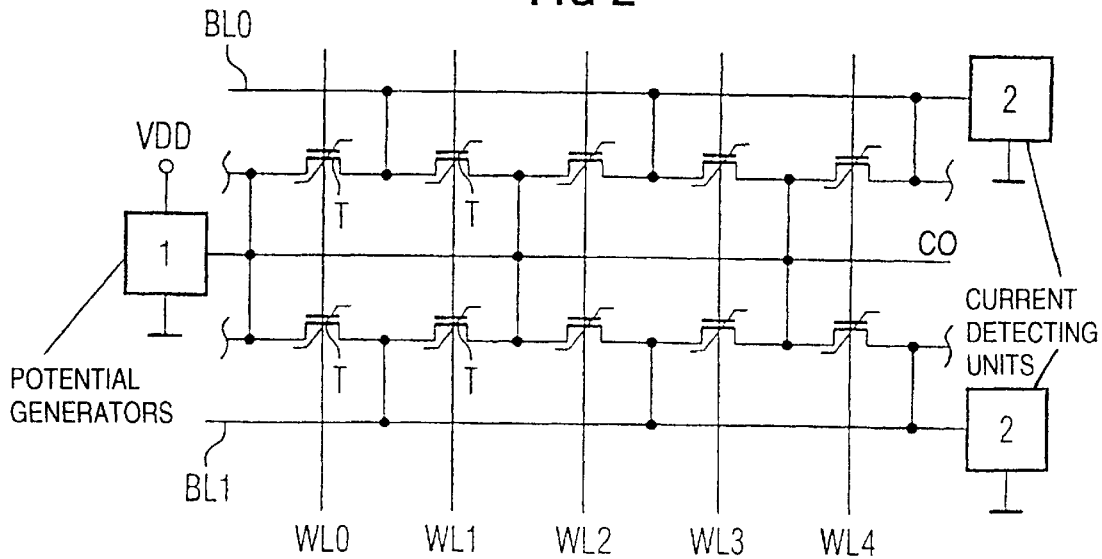
FIG. 2 shows a second exemplary embodiment in which each control line is assigned to two bit lines.

FIG. 2 shows a second exemplary embodiment of the integrated memory according to the invention. In this, one of the control lines Ci is in each case assigned to two of the bit lines BLi.

Only one of these groups of three, formed by an associated control line and two bit lines, has been illustrated in FIG. 2. The group illustrated in FIG. 2 is adjoined at the top and bottom by further identical groups.

In FIG. 2, the control line Ci is again connected to the output of a potential generator 1. The two bit lines BL0, BL1 are connected to a respective current detection unit 2. The control line C0 is connected to the two bit lines BLi in each case via a multiplicity of memory transistors T. In this case, the controllable paths of the memory transistors T are arranged parallel to the bit lines BLi and the control lines Ci. Respectively adjacent memory transistors T have a common source/drain region.

In the event of a read access, the potential generator 1 brings the control line C0 to a high potential VDD. In addition, one of the word lines WLi is brought to a high potential, with the result that the memory transistors T connected to the word line are selected. Via these memory transistors T, a respective drain current flows from the control line C0 to each of the two bit lines BLi. The magnitude of this drain current is again dependent on the logic state stored in the memory transistor T. The respective drain current is again evaluated by means of the current detection units 2.

FIG. 3 shows a larger detail from the memory illustrated in FIG. 2, in which, for reasons of clarity, only the bit lines BLi, the control lines Ci and the word lines WLi have been illustrated without the memory transistors T. The illustration shows two adjacent groups of in each case two bit lines BLi and a control line Ci of the type illustrated in FIG. 2. FIG. 3 shows that a total of four memory cells can be evaluated simultaneously, via the two control lines Ci and the four bit lines BLi, by feeding the drain current of the memory transistors T to the four current detection units 2.

FIG. 4 shows a modification of the exemplary embodiment illustrated in FIG. 3. The differences with regard to FIG. 3 consist in the assignment of the current detection units to the bit lines BLi. In FIG. 4, two of the bit lines Bli are in each case assigned to a current detection unit 21, 22. This assignment is effected by means of multiplexers Mux1, Mux2, via which the two bit lines are connected to the associated current detection units 21, 22. In FIG. 4, the bit lines BL0 and BL2 are connected to the first current detection unit 21 via the first multiplexer Mux1 and the bit lines BL1 and BL3 are connected to the second current detection unit 22 via the second multiplexer Mux2.

In the event of a read access, although four memory cells are again selected simultaneously through activation of one of the word lines WLi, each multiplexer Muxi connects only one of the two bit lines connected to it to the associated current detection unit 21, 22.

The multiplexers Muxi are fed column addresses CADR depending on which they connect one of the bit lines BLi connected to them to the current detection unit 21, 22. In this exemplary embodiment, when a first column address CADR is present, for example, the two multiplexers connect the bit lines BL0 and BL1 to the two current detection units 21, 22. When a second column address is present, they connect the bit lines BL2 and BL3 to the current detection units 21, 22. In this way, although fewer stored information items can be read simultaneously from the memory than in the case of the exemplary embodiment shown in FIG. 3, this is nonetheless not a disadvantage if the number of external terminals of the memory is limited, as is generally customary. As an advantage over the memory shown in FIG. 3, the memory shown in FIG. 4 has a smaller number of current detection units 21, 22.

In the case of the exemplary embodiment in FIG. 4, two of the bit lines BLi are in each assigned to a current detection unit 21, 22 via a multiplexer Muxi. Other exemplary embodiments are possible in which an arbitrary number of bit lines BLi are fed to each multiplexer Muxi.

We claim:

1. An integrated memory, comprising:
    a plurality of memory cells, each one of said plurality of said memory cells including a ferroelectric memory transistor having a control electrode with a ferroelectric layer that can assume at least two different polarization states;
    a plurality of word lines that essentially run in a first direction;
    a plurality of bit lines that essentially run in a second direction that is perpendicular to the first direction; and
    a plurality of control lines that essentially run in the second direction;
    each one of said memory transistors including a controllable path that connects one of said plurality of said bit lines to one of said plurality of said control lines;
    said control electrode of each one of said memory transistors is connected to one of said plurality of said word lines;
    a respective one of said plurality of said control lines is configured between two of said plurality of said bit lines and is connected to said two of said plurality of said bit lines by said controllable paths of a plurality of said memory transistors;
    said controllable paths of said memory transistors are configured parallel to said plurality of said bit lines and parallel to said control lines; and
    ones of said memory transistors that are connected to a given one of said plurality of said bit lines have common source/drain regions.

2. The integrated memory according to claim 1, comprising:
    a plurality of current detecting units for detecting currents that flow through said memory transistors and between said plurality of said control lines and said plurality of said bit lines during a read access;
    each one of said plurality of said current detecting units are connected to a respective one of said plurality of said bit lines.

3. The integrated memory according to claim 2, comprising:
    a first multiplexer and a second multiplexer;
    said plurality of said current detecting units include a first current detecting unit and a second current detecting unit;
    two of said plurality of said bit lines are connected to two different ones of said plurality of said control lines via respective ones of said memory transistors;
    said first multiplexer has a first operating state in which one of said two of said plurality of said bit lines is connected to said first current detecting unit;
    said first multiplexer has a second operating state in which another one of said two of said plurality of said bit lines is connected to said first current detecting unit;

two others of said plurality of said bit lines are connected to said two different ones of said plurality of said control lines via respective ones of said memory transistors;

said second multiplexer has a first operating state in which one of said two others of said plurality of said bit lines is connected to said second current detecting unit; and said second multiplexer has a second operating state in which another one of said two others of said plurality of said bit lines is connected to said second current detecting unit.

4. The integrated memory according to claim 1, comprising:

a first multiplexer and a second multiplexer; and a first current detecting unit and a second current detecting unit;

two of said plurality of said bit lines are connected to two different ones of said plurality of said control lines via respective ones of said memory transistors;

said first multiplexer has a first operating state in which one of said two of said plurality of said bit lines is connected to said first current detecting unit;

said first multiplexer has a second operating state in which another one of said two of said plurality of said bit lines is connected to said first current detecting unit;

two others of said plurality of said bit lines are connected to said two different ones of said plurality of said control lines via respective ones of said memory transistors;

said second multiplexer has a first operating state in which one of said two others of said plurality of said bit lines is connected to said second current detecting unit; and said second multiplexer has a second operating state in which another one of said two others of said plurality of said bit lines is connected to said second current detecting unit.

* * * * *